United States Patent
Hackl et al.

(10) Patent No.: US 10,126,345 B2
(45) Date of Patent: Nov. 13, 2018

(54) DEVICE AND METHOD FOR INSULATION MONITORING IN A POWER SUPPLY SYSTEM INCLUDING A HIGH-RESISTANCE GROUNDED NEUTRAL POINT

(71) Applicant: Bender GmbH & Co. KG, Gruenberg (DE)

(72) Inventors: Dieter Hackl, Fernwald (DE); Eckhard Broeckmann, Buseck (DE); Burkhard Macht, Hungen (DE)

(73) Assignee: BENDER GMBH & CO. KG, Gruenberg (DE)

( * ) Notice: Subject to any disclaimer, the term of this patent is extended or adjusted under 35 U.S.C. 154(b) by 206 days.

(21) Appl. No.: 14/568,930

(22) Filed: Dec. 12, 2014

(65) Prior Publication Data

US 2015/0168481 A1    Jun. 18, 2015

(30) Foreign Application Priority Data

Dec. 13, 2013    (DE) .................... 10 2013 225 946

(51) Int. Cl.
  *G01R 31/02*    (2006.01)
  *G01R 27/18*    (2006.01)
  (Continued)

(52) U.S. Cl.
  CPC .......... *G01R 31/025* (2013.01); *G01R 27/18* (2013.01); *G01R 31/086* (2013.01); *G01R 31/14* (2013.01)

(58) Field of Classification Search
  CPC ..... G01R 27/18; G01R 31/1272; G01R 31/14
  (Continued)

(56) References Cited

U.S. PATENT DOCUMENTS 4,011,483 A * 3/1977 Meadows ............ H02H 11/001
                                                324/510
4,589,046 A * 5/1986 Takata ..................... H02H 3/16
                                                361/42

(Continued)

FOREIGN PATENT DOCUMENTS

CN          1786726 A        6/2006
CN        101563824 A       10/2009
            (Continued)

*Primary Examiner* — Jeff Natalini
(74) *Attorney, Agent, or Firm* — King & Schickli, PLLC

(57) ABSTRACT

A device and method is for insulation monitoring in a power supply system composed of a main system including a neutral point that is high-resistance grounded via a neutral-point resistance and, optionally, of at least one subsystem, wherein the main system and the subsystem each have a differential current measuring device for registering a differential current.

Figure 1:
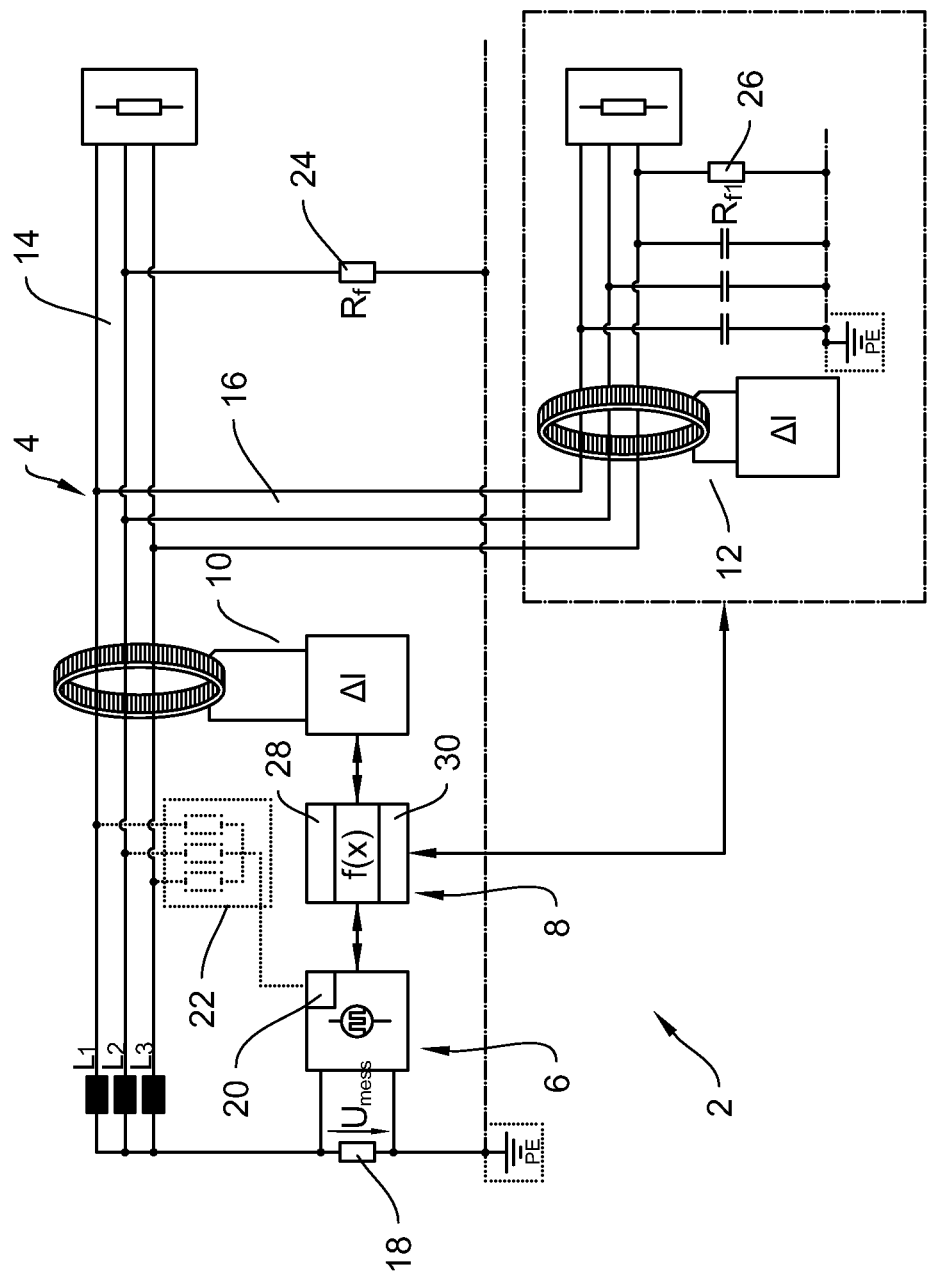

The invention is based on feeding a measuring signal into the optionally branched HRG system via an active measuring method and registering the fault current driven by the measuring signal in the outgoing power feeds to be monitored by means of a differential current measurement and using the registered fault current in an evaluating device to determine the total insulation resistance of the power supply system and to determine the partial insulation resistances of the main system and potentially present subsystems. Furthermore, the insulation monitoring device can be employed for insulation fault location.

20 Claims, 2 Drawing Sheets

(51) Int. Cl.
  *G01R 31/08* (2006.01)
  *G01R 31/14* (2006.01)

(58) Field of Classification Search
  USPC .......................................................... 324/551
  See application file for complete search history.

(56) References Cited

U.S. PATENT DOCUMENTS

| | | | | |
|---|---|---|---|---|
| 5,066,920 A * | 11/1991 | Suptitz | .................. | G01R 27/18 |
| | | | | 324/510 |
| 6,154,036 A | 11/2000 | Baldwin | | |
| 8,487,635 B1 * | 7/2013 | Paul | .................. | G01R 19/2513 |
| | | | | 324/522 |
| 2009/0296289 A1 | 12/2009 | Valdez et al. | | |
| 2010/0315095 A1 * | 12/2010 | Younsi | .................. | H01F 38/30 |
| | | | | 324/547 |
| 2012/0249336 A1 * | 10/2012 | Moell | .................. | G01R 15/18 |
| | | | | 340/646 |
| 2013/0218491 A1 * | 8/2013 | Wei | ........................ | G01R 31/42 |
| | | | | 702/58 |
| 2014/0312877 A1 * | 10/2014 | Kammer | ................ | G01R 19/10 |
| | | | | 324/76.11 |

FOREIGN PATENT DOCUMENTS

| | | | |
|---|---|---|---|
| DE | 3003902 A1 | 8/1981 | |
| DE | 19837933 A1 | 3/2000 | |
| DE | 10355086 A1 | 6/2005 | |
| WO | 0215355 A2 | 2/2002 | |
| WO | 2005050229 A1 | 6/2005 | |
| WO | WO2005050229 * | 6/2005 | ............. G01R 27/18 |

* cited by examiner

DEVICE AND METHOD FOR INSULATION MONITORING IN A POWER SUPPLY SYSTEM INCLUDING A HIGH-RESISTANCE GROUNDED NEUTRAL POINT

TECHNICAL FIELD

The invention relates to a device and to a method for insulation monitoring in a power supply system that is composed of a main system including a neutral point that is high-resistance grounded via a neutral-point resistance and, optionally, of at least one subsystem, wherein the main system and the subsystem each have a differential current measuring device for registering a differential current.

BACKGROUND

To ensure high availability and operational safety of the electrical power supply and to guarantee personnel safety in the operating area of electrical installations, power supply networks are widely used whose active components are separated from the ground potential in contrast to grounded network types. In this kind of power supply network, called ungrounded IT system, an active conductor may exhibit an insulation fault without making it necessary to interrupt the ongoing operation of the installation because no closed circuit can form in this first fault case owing to the ideally infinitely high impedance value between the conductor and ground. In this context, an insulation fault is a faulty state of the IT system that causes the insulation resistance to drop below the admissible insulation level.

Apart from these ungrounded IT systems, another type of network exists worldwide in which a neutral point is connected to ground via sufficiently high impedance. Said impedance can be designed as an ohmic resistance and can be configured to have high or low resistance. In case of the high-resistance grounding considered here, known internationally as HRG, said neutral-point resistance limits an occurring fault current to a value that does not yet cause an overcurrent protection device to be triggered.

Oftentimes, HRG systems of this kind are configured in such a way that the fault current is limited to values between 5 A and 10 A in case of a first insulation fault and the HRG system does not shut down unless the fault current rises above 10 A. Thus, a limitation of the fault current to values of 300 mA, which is common in many European grounded power supply systems for fire protection purposes, is not possible in an HRG system.

Starting from a fault current limited to 5 A, an active power of about 1.8 kW is generated at the current-limiting resistance of the HRG system in a 600 V three-phase network with a dead ground fault of one phase against ground. It appears as if the realization that a risk of fire becomes likely starting at active power values above 60 W, i.e. even with much lower fault currents due to high-resistance insulation fault resistances, has not been adequately considered by the advocates and operators of HRG systems.

The use of insulation monitoring devices, which are common in IT systems and which usually assume an ideally infinitely high (insulation) resistance of the IT system against ground, is impossible in most cases, however, because of the relatively low-resistance HRG connection to ground in comparison to an IT system. Thus, a (low) loss of insulation in which a high-resistance insulation fault remains with the consequently low fault current cannot be detected. The state of insulation of an HRG system is monitored mainly by means of differential current measurement at the neutral-point connection. It proves disadvantageous in this regard that symmetrical faults, mutually compensating leakage and fault currents and crosscurrents flowing through ground between the active conductors cannot be detected, either, by means of the central differential current measurement of the neutral-point current.

Further, simulation results for a fault constellation in an HRG system having a capacitive crosscurrent via ground show that, in case of a fault current with a peak value of about 30 A due to the insulation fault (resistance), the measurable differential current via the neutral-point resistance is below a peak value of 5 A. This means that, even though the current flow in the neutral-point connection is limited, exactly those dangerous fires are caused that were supposed to be prevented by the current limitation in the neutral point.

Similarly as in IT systems, in case of a first insulation fault, the fault must be located and eliminated as quickly as possible in HRG systems as well. Methods are known from the state of the art for fault location in an HRG system in which a part of the neutral-point resistance is pulsed and periodically bridged. The periodically lowered neutral-point resistance value leads to a pulsed increase of the fault current value in the faulty outgoing power feed of the HRG system. This pulsed fault current can be detected by means of differential current measurement. However, this method for insulation fault location has the disadvantage that, as a passive method, it cannot be extended to monitor symmetrical losses of insulation.

SUMMARY

The present invention is based on the object of proposing a device and a method for insulation monitoring in an HRG power supply system that can reliably determine also high-resistance insulation fault resistances against ground and that can determine the insulation resistance in particular in case of symmetrical faults. The system to be developed is to be capable of being integrated into existing HRG systems and additionally allow insulation fault location in the entire HRG power supply system.

With regard to a device, the object is attained in connection with the preamble of claim 1 by a measuring signal generator for generating an active measuring signal and for feeding the active measuring signal into the main system and by an evaluating device that is connected to the differential current measuring devices and to the measuring signal generator to evaluate differential current measuring signals.

The principle idea of the present invention is advantageously based on feeding a measuring signal into the optionally branched HRG system via an active measuring method and registering the fault current driven by the measuring signal in the outgoing power feeds to be monitored by means of differential current measurement and using the registered fault current to determine the total insulation resistance of the power supply system as well as to determine the partial insulation resistances of the main system and of potentially present subsystems. To this end, the insulation monitoring device has a measuring signal generator, which generates the measuring signal that is tailored to the HRG system and feeds it into the main system at the feed point of the main system and into potentially present subsystems. The fault current driven by the measuring signal is registered by the differential current measuring device in the main system and, in case of optionally installed subsystems, by the differential current measuring devices that are arranged in the subsystems in a distributed fashion and is supplied in each case to the evaluating device as a (differential current) measuring signal. The feeding of the active measuring signal allows detecting symmetrical insulation faults, mutually compensating leakage and fault currents and crosscurrents flowing through ground between conductors, wherein the measuring signal, as a common-mode signal, drives the occurring fault currents as measurable differential current portions via the active conductors of the power supply system.

Thus, the insulation monitoring device according to the invention is capable of preventively determining significantly higher-resistance insulation resistances and accompanying insulation faults even in HRG systems.

Moreover, the above-cited 60 W active power limit in fault resistances can be observed owing to the possibility of detecting even low insulation losses, i.e. in case of high-resistance insulation resistances with small fault currents.

In a convenient embodiment, the active measuring signal is a measuring voltage ($U_{mess}$) that is fed serially to the neutral-point resistance.

In this embodiment, the measuring signal generator for feeding the measuring voltage is configured as a low-resistance voltage source that is connected in series with the neutral-point resistance.

In an alternative embodiment, the active measuring signal is a measuring current that is fed in parallel to the neutral-point resistance.

In this case, the measuring signal generator for feeding the measuring current is configured as a high-resistance current source and is connected in parallel to the neutral-point resistance.

Since the neutral-point resistance is present in nearly all existing HRG systems, this fact can be advantageously utilized in a technically and economically simple manner to feed in the measuring signal. The neutral-point resistance represents an electrically and spatially central point in the HRG system so that the measuring signal fed in between the neutral point and ground acts as a driving source for all fault currents that occur at any point in the network because of insulation faults. When an insulation fault occurs, the measuring circuit between the network and ground closes via the insulation fault resistance and generates a fault current that can be registered as a differential current by all differential current measuring devices that are located in that circuit.

Both options of feeding the active measuring signal have the advantage that the value of the neutral-point resistance remains unchanged, i.e. no pulsed neutral-point resistance change occurs, and thus the current limitation as a specified system property stays at a constant value, too. By evaluating the relation between the measuring signal and the differential current, a significantly better resolution can be achieved, even in case of high-resistance insulation impedances, than by varying the neutral-point resistance.

Furthermore, the insulation monitoring device has an artificial neutral point at the outer conductors of the main system, via which a voltage signal against ground can be tapped.

By forming the artificial neutral point at the outer conductors of the main system, a voltage signal against ground can be obtained, which allows calculating the insulation resistances in connection with the differential current measurements or which can be used for controlling the measuring signal.

In another embodiment, the measuring signal generator has a control unit for controlling the generated active measuring signal, wherein the active measuring signal appearing in the main system is fed back as the voltage signal that can be tapped via the artificial neutral point.

The control unit ensures that a specific adjustment of one or multiple measuring signal parameters in the measuring signal generator appear correctly on the side of the main network even after passing through the generator or transformer of the network supply so as to guarantee a reliable detection of the fault current driven by the measuring signal. In this process, the fed-in measuring signal that appears at the main system is tapped as a common-mode signal at the outer conductors of the main system and fed back into the control unit of the measuring signal generator via an artificial neutral point.

In a simplified circuit arrangement, in particular in case of less complex shapes of the measuring signal, a continuous measurement of the voltage at the artificial neutral point and the corresponding processing of this voltage signal in the evaluating unit may also suffice instead of feedback control.

In an advantageous manner, a signal shape and signal parameters of the active measuring signal can be adapted to electrical characteristics of the power supply system to be monitored.

To ensure a registration as error-free as possible of the differential current portion that is caused by the fed measuring signal, the signal shape and the signal parameters of the measuring signal can be adapted to the electrical characteristics of the HRG system.

In this way, the characteristic properties of the HRG system can in particular be included in the evaluation by taking into account the characteristics such as the load capacity of the neutral-point resistance, available network leakage capacitances, the existing insulation level and the sensitivity of the HRG system to common-mode voltages and can be included as soon as in the selection of the measuring signal shape and its parameterization.

Furthermore, the evaluating device has a data memory for storing the signal shape and the signal parameters of the active measuring signal and for storing the electrical characteristics of the power supply system.

Thus, information about the fed measuring signal is available to the evaluating device with regard to a quick and exact evaluation of the registered differential currents.

In a preferred embodiment, the evaluating device has a processing unit for performing digital signal processing algorithms to extract a fault current portion driven by the active measuring signal from each of the registered differential current measuring signals, the stored signal parameters and the electrical characteristics.

On the basis of the differential currents registered by the differential current measuring devices arranged in a distributed fashion and being aware of the signal parameters of the fed measuring voltage and of the electrical characteristics of the power supply system, those differential current portions that are driven by the fed measuring signal are determined first in the processing unit by methods of digital signal processing.

Further, a processing rule for determining the total insulation resistance of the power supply system and, optionally, for determining the partial insulation resistances of the main system and of the subsystems on the basis of the extracted fault current portions is implemented in the processing unit of the evaluating device.

Starting from the extracted fault currents, in a further step, the processing unit determines the total insulation resistance of the power supply system and the optionally present partial insulation resistances of the main system and of the subsystems.

In another preferred embodiment, the evaluating device for insulation fault location is configured to locate an insulation fault on the basis of the registered differential currents.

The insulation monitoring device can be extended for insulation fault location by configuring the evaluating device. In this case, the signal generator acts as an active test current source that drives a test current through the insulation fault (resistance), which is detected by the respective differential current measuring devices located in that test circuit.

Advantageously, the subsystem can have an evaluating device that is connected to the differential current measuring device of said subsystem to autarkically evaluate the differential current measuring signal provided by the differential current measuring device of said subsystem.

In this embodiment, the subsystem has its own evaluating device, which allows an autarkic functioning of the respective subsystem with regard to the evaluating functionality.

Further, the subsystem can have an artificial neutral point for voltage measurement against ground.

Voltage measurement by means of an artificial neutral point at the entry of the subsystem may be required in particular in highly branched power supply systems having long feed lines between the systems in order to enable the subsystem to perform the evaluation with the right phase and synchronously to the measuring signal generator.

With regard to a method, the underlying object of the invention is attained by generating an active measuring signal and feeding the active measuring signal into the main system by means of a measuring signal generator and by evaluating differential current measuring signals by means of an evaluating device that is connected to the differential current measuring devices and to the measuring signal generator.

The functionality of the afore-described device for insulation monitoring is based on a method for insulation monitoring that comprises, as substantial features, generating and feeding an active measuring signal and evaluating the differential current measuring signals by means of an evaluating device.

According to the invention, an active measuring signal is generated in the measuring signal generator and fed into the main system and into potentially present subsystems at the feed point of the main system. In contrast to a pulsed bridging of the neutral-point resistance known from the state of the art, the active measuring signal allows determining the insulation resistances in case of symmetrical faults, in case of mutually compensating leakage and fault currents and in case of crosscurrents flowing through ground between conductors of the power supply system.

Moreover, the active measuring signal can be adapted to the electrical properties of the power supply system so that the differential current portions driven by said measuring signal can be reliably registered as measuring currents in the course of the insulation monitoring operation and be separated from interference signals. The differential currents that are registered by the differential current measuring devices arranged in a distributed fashion are transmitted as differential current measuring signals to the evaluating device.

In a technically and economically easily implemented manner, the active measuring signal is coupled in serially to the neutral-point resistance as a measuring voltage or in parallel to the neutral-point resistance as a measuring current.

Conveniently, a voltage signal against ground is tapped by outer conductors of the main system via an artificial neutral point.

The voltage signal that can be tapped allows calculating the insulation resistances in connection with the differential current measurements or can be utilized for controlling the measuring signal.

Further, the generated active measuring signal is controlled, wherein the active measuring signal appearing in the main system is fed back as the voltage signal that can be tapped via the artificial neutral point.

This measuring signal control allows an adjustment of the signal parameters with regard to a detection as free of interference as possible of the differential current portions while taking into account the characteristic properties of the network.

In another advantageous embodiment, the signal shape and signal parameters of the active measuring signal are adapted to electrical characteristics of the power supply system to be monitored.

With this measure, it is possible to optimally adjust the signal parameters of the active measuring signal while taking into account the electrical properties of the power supply network with regard to a secure registration of the fault currents driven by the measuring signal.

Furthermore, the signal shape and the signal parameters of the active measuring signal and the electrical characteristics of the power supply system are stored in a data memory of the evaluating device.

In connection with the application of digital signal processing methods, the use of the stored information about the active measuring signal and about the electrical properties of the power supply system allows secure detection of the differential current portions driven by the active measuring signal.

In a preferred embodiment of the method, digital signal processing algorithms are performed in a processing unit of the evaluating device, which extract a fault current portion driven by the active measuring signal from each of the differential current measuring signals, the stored signal parameters and the electrical characteristics.

In another step, the total insulation resistance of the power supply system and, optionally, the partial insulation resistances of the main system and of the subsystems are determined in the processing unit of the evaluating device on the basis of the extracted fault current portions.

From the differential current measuring signals that are transmitted from the differential current measuring devices to the evaluating device, the respective fault current portions caused by the fed measuring signal are filtered out in a first step by methods of digital signal processing. From said fault current portions, the total insulation resistance of the power supply system and, optionally, the partial insulation resistances of the main system and of the subsystems can then be determined.

Furthermore, for insulation fault location, location of an insulation fault is carried out in the evaluating device on the basis of the registered differential currents.

The method for insulation monitoring can be extended to the effect that an insulation fault location is initiated in the evaluating device upon detection of an insulation fault.

Furthermore, an autarkic evaluation of the differential current measuring signal provided by the differential current measuring device of the subsystem is performed by means of an evaluating device in said subsystem.

With this implementation of the method, an independent evaluation with regard to determining the (partial) insulation resistance is possible in the respective subsystem.

Conveniently, a voltage can also be measured against ground by means of an artificial neutral point in the subsystem.

A voltage measurement in the subsystem may be necessary in particular in case of great conductor lengths in order to ensure the phase-synchronous evaluation of the measuring signal.

BRIEF DESCRIPTION OF THE DRAWING FIGURES

Other advantageous embodiment features arise from the following description and from the drawing, which illustrates a preferred embodiment of the invention by way of an example. In the drawing:

FIG. 1: shows a device 2 according to the invention for insulation monitoring and for insulation fault location in a branched power supply system 4.

Figure 2:
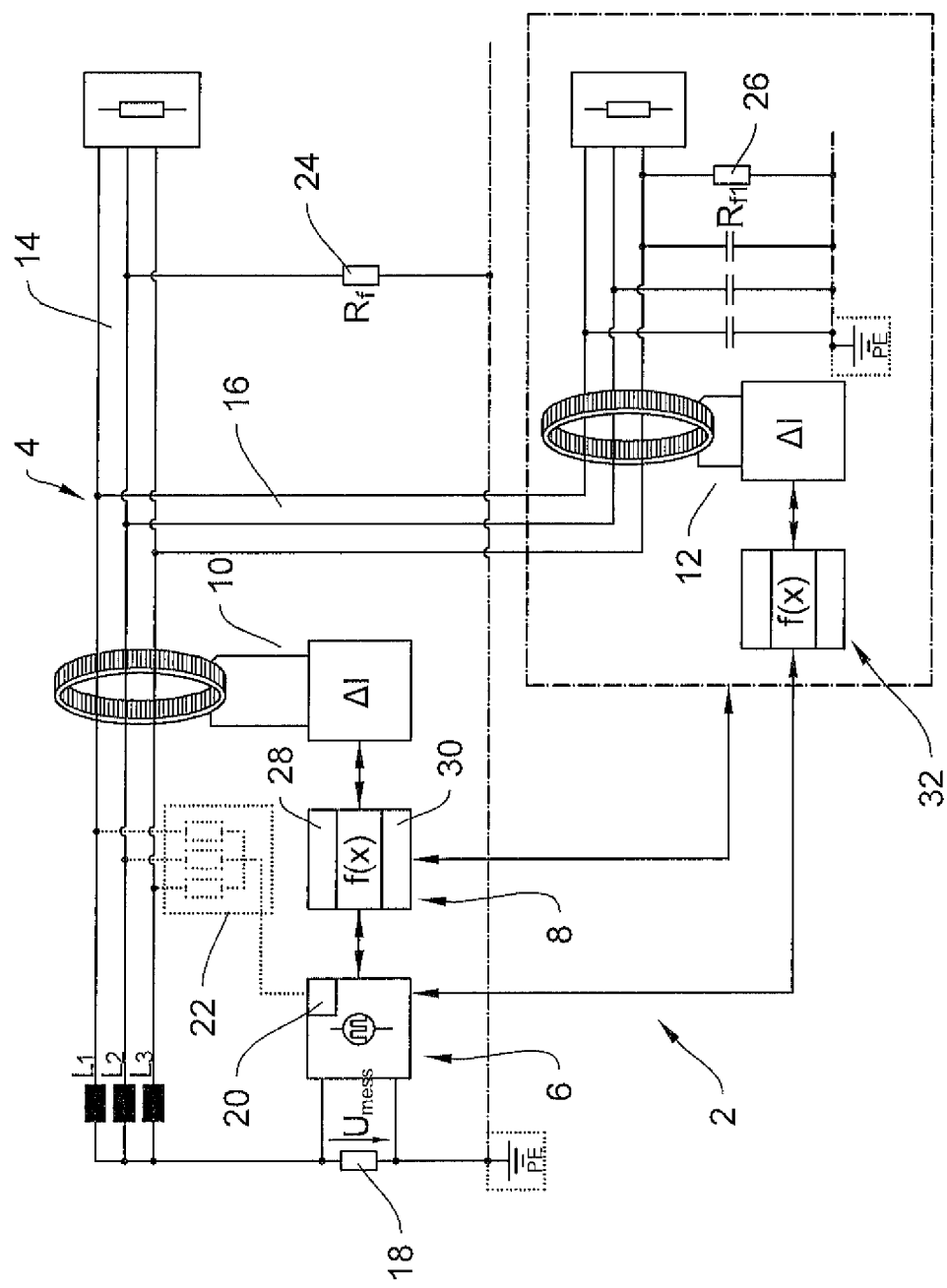

FIG. 2: shows the device 2 of FIG. 1 extended by an autarkic evaluating unit 32 in a subsystem 16.

DETAILED DESCRIPTION

The device 2 according to the invention illustrated in FIG. 1 for insulation monitoring and for insulation fault location comprises, as substantial functional blocks, a measuring signal generator 6, an evaluating device 8 and two differential current measuring devices 10 and 12. The device 2 is integrated in a branched 3-phase power supply system 4 (HRG system), which, in this exemplary embodiment, is composed of a main system 14 and a subsystem 16. A neutral point of the main system 14 is connected to ground PE via a neutral-point resistance 18.

The measuring signal generator 6 generates a measuring voltage $U_{mess}$ and injects it as a voltage drop into the power supply system 4 via the neutral-point resistance 18. The measuring signal generator 6 of the device 2 according to the invention can optionally have a control unit 20 for adjusting the measuring voltage $U_{mess}$, wherein a voltage signal in the form of a common-mode signal that is tapped at the outer conductors L1, L2, L3 of the main system 14 and supplied to the control unit 20 via an artificial neutral point 22 of the control unit 20 serves as input signal of the control unit 20.

In the present example, both the main system 14 and the subsystem 16 each exhibit an insulation fault 24, 26, which is represented by the insulation fault resistance $R_f$. The insulation fault 24 in the main system 14 leads to a fault current that is driven by the measuring voltage $U_{mess}$ and flows through the outer conductor L2 of the main system 14, whereas the fault current caused by the insulation fault 26 of the subsystem flows not only through the outer conductor L1 L3 of the main system 14 but additionally through the outer conductor L1 L3 of the subsystem 16 The fault current portion that is registered by the differential current measuring device 10 in the main system and driven by the measuring voltage is determined by the total insulation resistance of the HRG system 4. The fault current portion that is registered by the differential current measuring device 12 in the subsystem 16 and driven by the measuring voltage is determined by the (partial) insulation resistance of the subsystem of the HRG system 4. The differential current measuring devices 10, 12 transmit the registered differential currents as differential current measuring signals to the evaluating device 8. A processing unit 30 of the evaluating device 8 extracts the fault current portions driven by the measuring voltage $U_{mess}$ with the aid of the signal parameters of the measuring voltage $U_{mess}$ and of the electrical characteristics of the power supply system 4, which are stored in a data memory 28, and utilizes the fault current portions to determine the total insulation resistance of the power supply system 4 and the partial insulation resistance of the subsystem 16.

Apart from determining the insulation resistances, the device 2 according to the invention can also be employed for insulation fault location because the association of the differential current measuring devices 10, 12 with the outgoing power feeds (here main system 14 and subsystem 16) is known.

The device 2 according to the invention for insulation fault location can be integrated in a simple manner into existing HRG systems 4 because they are already equipped with differential current measuring devices 10, 12 and no interruption of the neutral-point connection is necessary owing to the injection of the measuring voltage via the neutral-point resistance 18.

In FIG. 2, the device 2 illustrated in FIG. 1 has been extended by an autarkic evaluation unit 32 in the subsystem 16 in order to allow an independent evaluation of the partial insulation resistance of the subsystem 16.

The invention claimed is:

1. A device (2) for insulation monitoring in a power supply system (4) comprising:
   a main system (14) including a neutral point that is high-resistance grounded via a neutral-point resistance (18), which includes the neutral point connected in series with the neutral point resistance (18) which is connected in series to ground, and at least one subsystem (16);
   the main system (14) and the subsystem (16) each having a differential current measuring device (10, 12) for registering a differential current, characterized by a measuring signal generator (6) for generating an active measuring signal and for feeding an active measuring signal into the main system (14) and by an evaluating device (8) that is connected to the differential current measuring devices (10, 12) and to the measuring signal generator (6) to evaluate differential current measuring signals;
   the active measuring signal is a measuring voltage (Umess) that is fed serially to the neutral-point resistance (18), configured as a low-resistance voltage source or the active measuring signal is a measuring current that is fed in parallel to the neutral-point resistance (18).

2. The device (2) for insulation monitoring according to claim 1, characterized by an artificial neutral point (22) at the outer conductors (L1, L2, L3) of the main system (14), wherein a voltage signal can be tapped against ground via said artificial neutral point.

3. The device (2) for insulation monitoring according to claim 1, characterized in that the measuring signal generator (6) has a control unit (20) for controlling the generated active measuring signal, wherein the active measuring signal appearing in the main system (14) is fed back as the voltage signal that can be tapped via the artificial neutral point (22).

4. The device (2) for insulation monitoring according to claim 1, characterized in that a signal shape and signal parameters of the active measuring signal can be adapted to electrical characteristics of the power supply system (4) to be monitored.

5. The device (2) for insulation monitoring according to claim 4, characterized in that the evaluating device (8) has a data memory (28) for storing the signal shape and the signal parameters of the active measuring signal and for storing the electrical characteristics of the power supply system (4).

6. The device (2) for insulation monitoring according to claim 5, characterized in that the evaluating device (8) has a processing unit (30) for performing digital signal processing algorithms in order to extract a fault current portion that is driven by the active measuring signal from each of the registered differential current measuring signals, the stored signal parameters and electrical characteristics.

7. The device (2) for insulation monitoring according to claim 6, characterized in that a processing rule is implemented in the processing unit (30) of the evaluating device (8) to determine the total insulation resistance of the power supply system (4) and, if the power supply system (4) includes the main system (14) and at least one subsystem (16), to determine the partial insulation resistances of the main system (14) and of the subsystems (16) on the basis of the extracted fault current portions.

8. The device (2) for insulation monitoring according to claim 1, characterized in that for insulation fault location, the evaluating device (8) is configured to locate an insulation fault on the basis of the registered differential currents.

9. The device (2) for insulation monitoring according to claim 1, characterized in that the subsystem (16) has a subsystem evaluating device that is connected to the differential current measuring device (12) of said subsystem (16) to evaluate the differential current measuring signal provided by the differential current measuring device (12) of said subsystem (16).

10. The device (2) for insulation monitoring according to claim 1, characterized in that the subsystem (16) for voltage measurement against ground (PE) has an artificial neutral point (22).

11. A method for insulation monitoring in a power supply system (4) comprising a main system (14) including a neutral point that is high-resistance grounded via a neutral-point resistance (18), which includes the neutral point connected in series with the neutral-point resistance (18) which is connected in series to ground, and at least one subsystem (16), wherein a differential current is registered in each of the main system (14) and the subsystem, (16) by a differential current measuring device (10, 12), characterized by generation of an active measuring signal and feeding of the active measuring signal into the main system (14) by a measuring signal generator (6) and by evaluation of differential current measuring signals by an evaluating device (8) that is connected to the differential current measuring devices (10, 12) and to the measuring signal generator (6), wherein a measuring voltage (Umess) is injected as the active measuring signal serially to the neutral-point resistance (18), configured as a low-resistance voltage source, or a measuring current is injected as the active measuring signal in parallel to the neutral-point resistance (18).

12. The method for insulation monitoring according to claim 11, characterized in that a voltage signal is tapped against ground (PE) via an artificial neutral point (22) of outer conductors (L1, L2, L3) of the main system (14).

13. The method for insulation monitoring according to claim 11, characterized in that the generated active measuring signal is controlled, wherein the active measuring signal appearing in the main system (14) is fed back as the voltage signal that can be tapped via the artificial neutral point (22).

14. The method for insulation monitoring according to claim 11, characterized in that signal shape and signal parameters of the active measuring signal are adapted to electrical characteristics of the power supply system (4) to be monitored.

15. The method for insulation monitoring according to claim 14, characterized in that the signal shape and the signal parameters of the active measuring signal and the electrical characteristics of the power supply system (4) are stored in a data memory (28) of the evaluating device (8).

16. The method for insulation monitoring according to claim 15, characterized in that in a processing unit (30) of the evaluating device (8), digital signal processing algorithms are performed that extract a fault current portion driven by the active measuring signal from each of the registered differential current measuring signals and the stored signal parameters and the electrical characteristics.

17. The method for insulation monitoring according to claim 16, characterized in that in the processing unit (30) of the evaluating device (8), the total insulation resistance of the power supply system (4) and if the power supply system (4) includes the main system (14) and the at least one subsystem (16), the partial insulation resistances of the main system (14) and of the subsystems (16) are determined on the basis of the extracted fault current portions.

18. The method for insulation monitoring according to claim 11, characterized in that for insulation fault location, an insulation fault is located in the evaluating device (8) on the basis of the registered differential currents.

19. The method for insulation monitoring according to claim 11, characterized in that the differential current measuring signal that is provided by the differential current measuring of the subsystem (16) is evaluated by means of a subsystem evaluating device in said subsystem (16).

20. The method for insulation monitoring according to claim 11, characterized in that a voltage measurement against ground (PE) takes place in the subsystem (22) via an artificial neutral point.

* * * * *